(12) United States Patent
Zheng

(10) Patent No.: US 7,560,739 B2
(45) Date of Patent: Jul. 14, 2009

(54) MICRO OR BELOW SCALE MULTI-LAYERED HETEROSTRUCTURE

(75) Inventor: Jun-Fei Zheng, Westport, CT (US)

(73) Assignee: Intel Corporation, Santa Clara, CA (US)

( * ) Notice: Subject to any disclaimer, the term of this patent is extended or adjusted under 35 U.S.C. 154(b) by 269 days.

(21) Appl. No.: 10/879,390

(22) Filed: Jun. 29, 2004

(65) Prior Publication Data

US 2005/0285124 A1 Dec. 29, 2005

(51) Int. Cl.
  *H01L 29/201* (2006.01)
  *H01L 33/00* (2006.01)
(52) U.S. Cl. .............................. 257/94; 257/85; 257/90
(58) Field of Classification Search .................. 437/5; 375/41; 385/14, 17; 359/248, 260; 257/95, 257/79–94, 181–186, E51.022, E51.026, 257/E33.001, E31.105, E31.099, E25.028
See application file for complete search history.

(56) References Cited

U.S. PATENT DOCUMENTS

| | | | |
|---|---|---|---|
| 3,643,136 A | | 2/1972 | Tuft |
| 4,198,444 A | | 4/1980 | Yerman |
| 4,356,056 A | | 10/1982 | Cornette et al. |
| 4,829,357 A | * | 5/1989 | Kasahara ............... 257/113 |
| 4,916,716 A | | 4/1990 | Fenner et al. |
| 4,958,202 A | * | 9/1990 | Kinoshita et al. ......... 257/96 |
| 5,001,076 A | | 3/1991 | Mikkelson |
| 5,075,239 A | * | 12/1991 | Tegude .................. 438/23 |
| 5,121,174 A | | 6/1992 | Forgerson, II et al. |
| 5,144,410 A | | 9/1992 | Johnson |
| 5,475,256 A | * | 12/1995 | Sawada et al. ........... 257/577 |
| 5,561,301 A | * | 10/1996 | Inoue .................... 257/13 |
| 5,710,439 A | * | 1/1998 | Ohkubo .................. 257/85 |
| 5,789,765 A | * | 8/1998 | Nishikata et al. ......... 257/86 |
| 6,005,261 A | | 12/1999 | Konstantinov |
| 6,007,733 A | | 12/1999 | Jang et al. |
| 6,100,555 A | * | 8/2000 | Negishi ................. 257/284 |
| 6,115,169 A | * | 9/2000 | Takagi et al. ............ 359/248 |
| 6,225,648 B1 | * | 5/2001 | Hsieh et al. .............. 257/95 |

(Continued)

FOREIGN PATENT DOCUMENTS

EP 0 788 169 A2 8/1997

(Continued)

OTHER PUBLICATIONS

Alavi, Kamal, et al. "A Highly Uniform, and High Throughput, Double Selective pHEMT Process Using an All Wet Etch Chemistry," Copyright 2002 GaAsMANTECH, Inc.

*Primary Examiner*—Dao H Nguyen
*Assistant Examiner*—Tram H Nguyen
(74) *Attorney, Agent, or Firm*—Schwabe, Williamson & Wyatt, P.C.

(57) ABSTRACT

A heterostructure having a first and a second layer, in micrometer or smaller (e.g. nanometer) scale, arranged in a configuration defining at least one undercut at one side of the second layer, underneath the first layer, is described herein. In various embodiments, the undercut is filled with passivation materials to protect the layers underneath the first layer. Further, in various embodiments, a large metal contact layer including coverage of the first layer sidewall may be employed to provide significant increase in contact area, and to reduce the device contact resist value.

22 Claims, 4 Drawing Sheets

U.S. PATENT DOCUMENTS

| | | |
|---|---|---|
| 6,232,162 B1 | 5/2001 | Kao |
| 6,309,933 B1* | 10/2001 | Li et al. .................. 438/291 |
| 6,392,781 B1* | 5/2002 | Kim et al. ................ 359/248 |
| 6,489,251 B2 | 12/2002 | Chang |
| 6,642,071 B2 | 11/2003 | Cheng |
| 6,661,557 B2* | 12/2003 | Kouchi et al. ........... 359/248 |
| 6,760,141 B2* | 7/2004 | Takagi .................... 359/248 |
| 2001/0023947 A1* | 9/2001 | Gutierrez-Aitken et al. . 257/183 |
| 2002/0030200 A1* | 3/2002 | Yamaguchi et al. ........ 257/184 |
| 2003/0047753 A1* | 3/2003 | Fujita et al. ............... 257/197 |
| 2003/0086461 A1* | 5/2003 | Kudo et al. ............... 372/45 |
| 2003/0230234 A1 | 12/2003 | Nam et al. |
| 2004/0022476 A1* | 2/2004 | Kirkpatrick et al. ........ 385/14 |
| 2004/0065888 A1* | 4/2004 | Sato et al. ................. 257/79 |
| 2005/0051856 A1* | 3/2005 | Ono et al. ................. 257/411 |
| 2005/0238281 A1* | 10/2005 | Epitaux et al. ............. 385/16 |

FOREIGN PATENT DOCUMENTS

| | | |
|---|---|---|
| FR | 2 610 451 A1 | 8/1988 |
| GB | 2352874 | 7/2001 |
| JP | 60207340 A | 10/1985 |
| JP | 60235436 | 11/1985 |
| JP | 02000164732 A | 6/2000 |
| JP | 06021432 | 1/2004 |

* cited by examiner

MICRO OR BELOW SCALE MULTI-LAYERED HETEROSTRUCTURE

FIELD OF THE INVENTION

The present invention relates generally, but not limited to, the fields of semiconductor devices and optoelectronics.

BACKGROUND OF THE INVENTION

Multi-layered heteostructures are employed to implement devices for a number of applications. These applications include, but are not limited to, optoelectronic components (e.g. PIN junction or multi-quantum well). The functionality of these multi-layered heteostructures are typically built from layer to layer in a vertical direction, using different semiconductor materials. Further, the multi-layered heteostructures are vertically etched leading to the exposure of their sidewalls, and polymer is spun to seal the sidewalls. To facilitate provision of a contact to one of these devices, the polymer may be etched back to expose the top semiconductor layer, to allow a metal contact to be deposited thereon. Alternatively, a vertical via may be etched to open the polymer to facilitate contact between the top semiconductor layer and the metal contact.

However, both practices have disadvantages. In particular, the former practice may not be able to clear the top semiconductor layer without exposing the sidewalls of some of the device layers underneath the top layer. Whereas, the latter practice is difficult and complicated, especially in the smaller than micro scale, e.g. at nanometer scale. As at the nanometer scale, not only alignment of the via mask becomes very difficult, making of the via mask in and of itself becomes almost impossible, due to current sub-micro lithography is unable to accurately resolve nanometer via printing. Also, at nanometer scale, the via approach will not allow the full use of the available area of the top semiconductor layer because a typical via approach requires some margin so the via must be smaller than the device. Even if the first practice is able to open the whole area of the top device layer, at micrometer or nanometer scale, the top semiconductor area may not be sufficiently large to provide a desired low contact resist interconnect (as resist is inversely proportional to the contact area).

BRIEF DESCRIPTION OF THE DRAWINGS

The present invention will be described by way of exemplary embodiments, but not limitations, illustrated in the accompanying drawings in which like references denote similar elements, and in which.

DETAILED DESCRIPTION OF ILLUSTRATIVE EMBODIMENTS

Illustrative embodiments of the present invention include, but are not limited to, a multi-layered heteostructure with sealed sidewalls, including an overhanging semiconducting layer to reduce the likelihood of the integrity of the sealing being compromised during the formation of the multi-layered heteostructure, and/or to increase the device contact, method of making the multi-layered heteostructure, optoelectronic component having such multi-layered heteostructure, and system having such an optoelectronic component.

Various aspects of the illustrative embodiments will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials, and configurations are set forth in order to provide a thorough understanding of the illustrative embodiments. However, it will be apparent to one skilled in the art that the present invention may be practiced without the specific details. In other instances, well-known features are omitted or simplified in order not to obscure the illustrative embodiments.

The phrase "in one embodiment" is used repeatedly. The phrase generally does not refer to the same embodiment; however, it may. The terms "comprising", "having" and "including" are synonymous, unless the context dictates otherwise.

Figure 1:
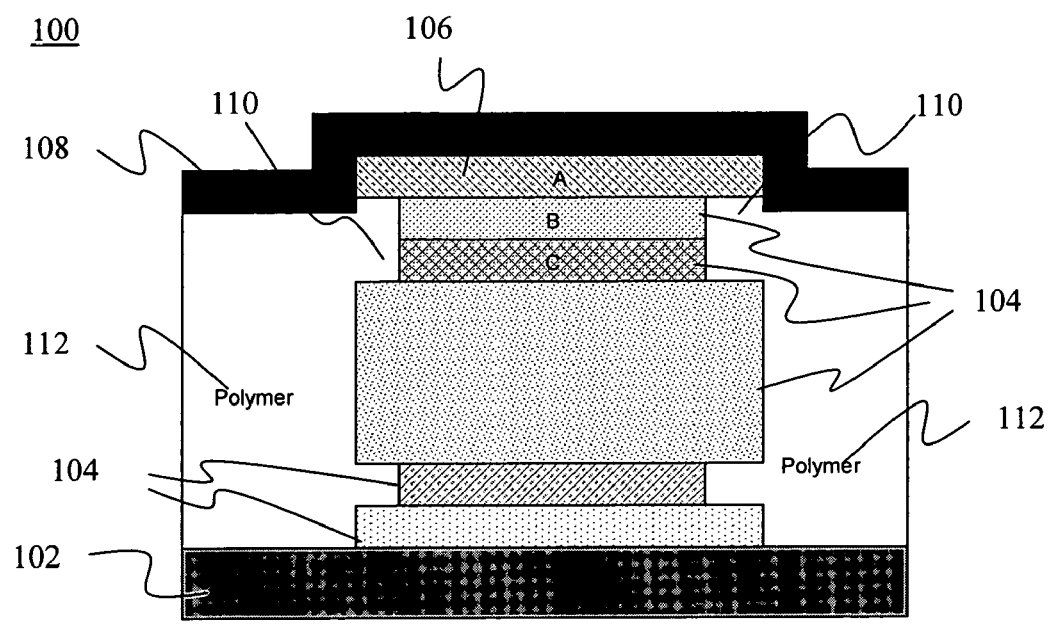
FIG. 1 illustrates a side view of a multi-layered heteostructure, in accordance with various embodiments of the present invention.

Referring now to FIG. 1, wherein a side view of a device having a multi-layered heteostructure in accordance with various embodiments is shown. As illustrated, for the embodiments, device 100 includes substrate 102, a heterostructure having layers 104-106, passivation material 112, and contact 108. In various embodiments, layers 104 may be active layers, while layer 106 is an inactive layer. As will be described in more detail below, the elements are designed and arranged in a manner, such that, layers 104-106 may be in micrometer or smaller scale (e.g. nanometer), and layers 104 may nonetheless be desirably sealed. Further, device 100 may be endowed with a contact that provides lower resist and/or facilitates easier alignment.

Typically, lower layers 104 are layers where dimension and passivation of their sidewalls may be important, and top layer 106 is a layer for e.g. Ohmic resist contact. Lower layers 104 are interconnected to contact 108 through top layer 106, without employing via, thereby eliminating the need of making and aligning, especially at nanometer scale via, in which such making of via and alignment is virtually impossible. Passivation material is provided to seal the sidewalls of lower layers 104 to reduce leakage and/or prevent the layers from being contacted, and thereby becoming shorted. Top layer 106 is designed to overhang the lower layers 104, defining one or more undercuts 110 at the sidewalls of lower layers 104, underneath top layer 106, to contribute to making possible the desired micrometer or smaller scale (e.g. nanometer) of layers 104-106, and the sealing of the lower layers 104. Further, contact 108 is designed to cover the top surface and the sidewalls of top layer 106 (to be described more fully below).

For the illustrated embodiments, layers 104-106, in particular, lower layers 104, are constituted with two or more different semiconductor materials (as depicted by the different "fill patterns" of the layers in the Figures). Examples of suitable semiconductor materials include but are not limited to, InGaAs and InP. Further, passivation material 112 could be polymer. An example of a suitable polymer is BCB—Bisbensocyclotene.

Substrate 102 may be formed using InP or, or other carrier materials (e.g. Si). Contact 108 may be formed using e.g. Au, Pt, or other conductive materials, including alloys of these metals.

Figure 2:
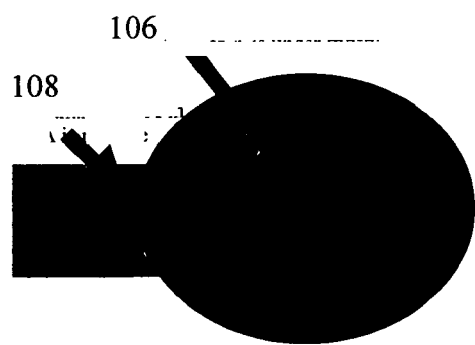
FIG. 2 illustrates a top view of the metal contact of FIG. 1, in accordance with various embodiments.

Referring now also to FIG. 2, where a top view of contact 108 is shown, in accordance with some embodiments. As illustrated, for the embodiments, contact 108 is sized in micrometer or larger scale (while layers 104-106 are smaller than contact 108, in sub-micrometer or even nanometer scale) to facilitate easier alignment of device 100. Further, in various embodiments, top layer 106 may be a 'thick" layer to increase the surface area of its sidewall in contact with contact 108. The lager size (e.g. width) of contact 108 may in turn reduce the interconnection resist, which is another benefit of the implementation. Note that illustrations of FIGS. 1-7 are not "scaled", nor necessarily "aligned".

Figure 3:
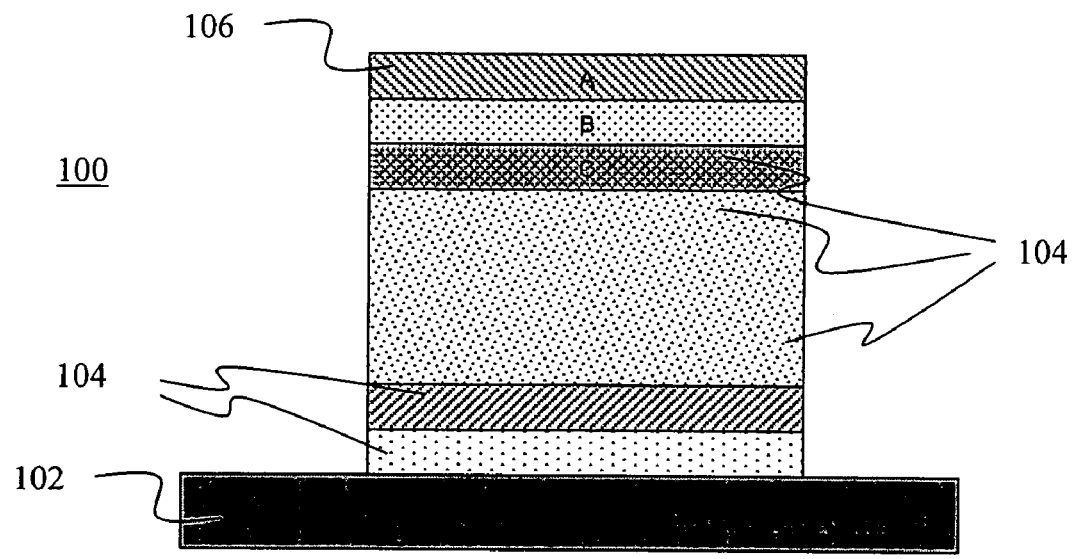
FIGS. 3-6 illustrate side views of the multi-layered heteostructure of FIG. 1 at different stages of its formation, in accordance with various embodiments.

Referring now to FIGS. 3-6, wherein various side views of the device of FIG. 1 at various stages of its formation, in accordance with various embodiments, are shown. As illustrated in FIG. 3, for the embodiments, initially, layers 104-106 of various desired semiconductor materials are successively formed on top of substrate 102. For the embodiments, layers 104-106 are of equal widths, e.g. at micrometer or smaller nanometer scale, at this stage. The layers may be formed one or more layers at a time, employing one or more fabrication techniques, deposition, dry etching, and so forth.

Figure 4:
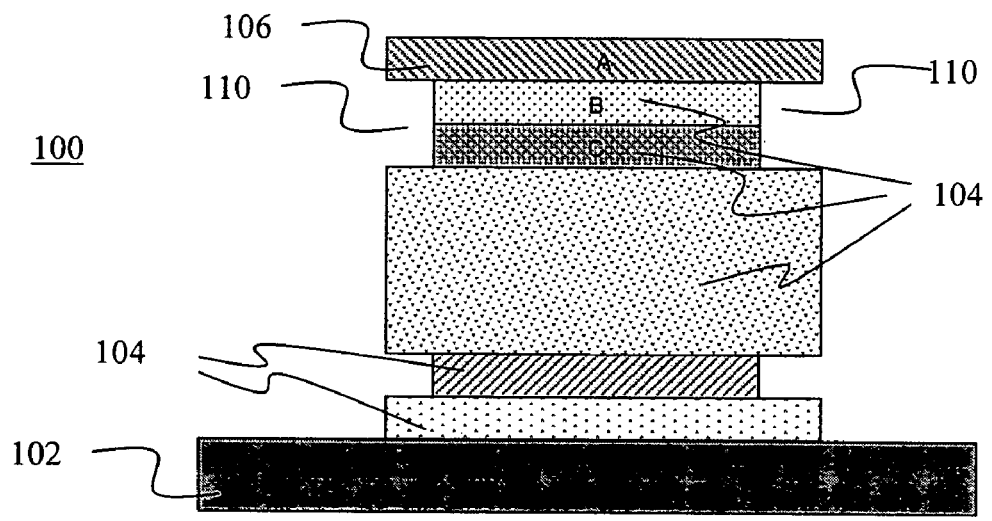

Then, lower layers 104 are successively wet etched for appropriate time periods to selectively narrow the widths of one or more of the lower layers 104, as desired, to effectuate the overhanging of top layer 106 and definition of the undercuts 110 (FIG. 4). Note that the widths of selected ones of the various lower layers 104 may equal each other (reduced or not), or may be unequal (i.e. shorter or longer than one another).

Various wet etching solutions may be employed. Typically, the wet etching solutions to be employed are dependent on the semiconductor materials employed to constitute the layers, which widths are to be narrowed. For example, a HCL based wet etching solution may be employed for etching faster at a layer formed based on InP, than a layer formed based on InGaAsP. Another example could be HBr. The durations of the various wet etching operations are dependent on the desired reduction in widths to be achieved for the various targeted layers. Note that when appropriately selected, during each wet etching operation, only the targeted layer or layers will react to the wet etching solution, resulting in the desired reduction in widths (or final widths).

Figure 5:
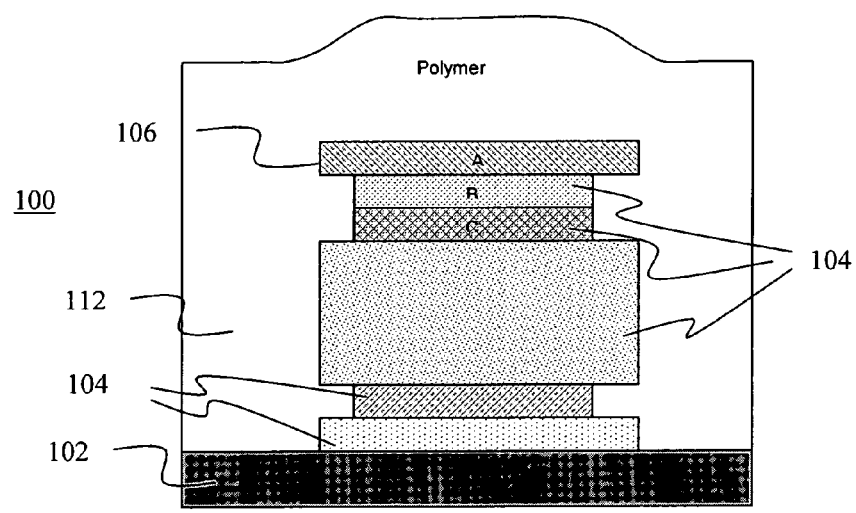

Then, as illustrated in FIG. 5, a passivation material 112, such as a polymer, is spun to fill undercuts 110 to seal the sidewalls of lower layers 104. However, as illustrated, typically, some amounts of excess passivation material 112 beyond what are needed by undercuts 110 will be deposited.

Figure 6:
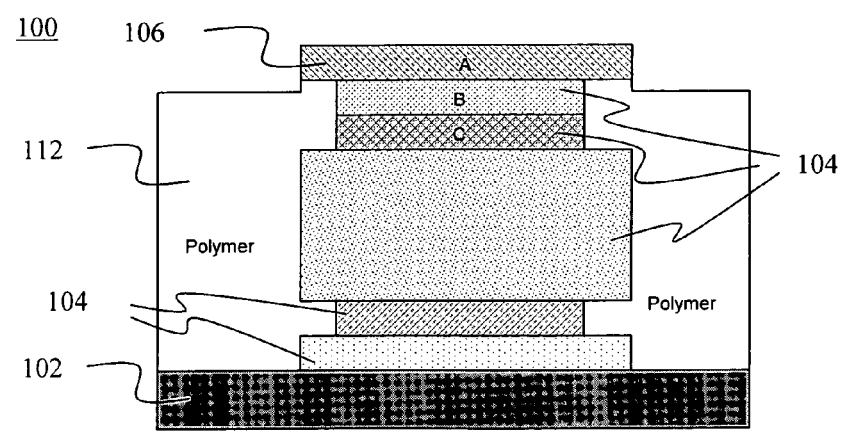

Next, as illustrated in FIG. 6, passivation material 112 is dry etched back to expose top layer 106. In various embodiments, passivation material may be dry etched back to a depth passing top layer 106 in part or in full, but not pass any lower layer 104 not having been wet etched to have their width reduced to narrower than top layer 106. Because of the protection offered by undercuts 110 filled with passivation material 112, the impact on lower layers 104 by (1) etch induced exposure of sidewall is eliminated; (2) any cracking of passivation material 112 resulted from the dry etching (which is known to occur some time) is likely to be rendered inconsequential.

After dry etching passivation material 112 to the desired depth, contact 108 is deposited on top of top layer 106 and the top surface of passivation material 112, forming device 100, and covering the sidewalls of top layer 106 in part or in full (depending on the depth of the earlier dry etching), as illustrated in FIG. 1.

In various embodiments, as described earlier, layer 106 may be designed to be sufficient thick, such that contact 108 (deposited on top and over the sidewalls of layer 106) provides an increased metal interconnect area. For example, if device 100 is of 10 nm in diameter, a 10 nm thick layer 106 can increase the contact area by 4× if the sidewalls are fully use (while in the case of a 100 nm thick layer 106, almost like a rod, can increase contact area by 40×). The increase of the contact area will proportionally reduce the contact resist by 4× (or 40×), which could be important for certain device applications. Further, while for ease of understanding, layer 106 has been described as one layer, in alternate embodiments, layer 106 may be one or more layers.

Accordingly, a multi-layered heterostructure with layers in micrometer or smaller scale (e.g. nanometer scale) may be provided, with the desired sealing of the layers, and without employment of via to interconnect the layers to the contact.

Figure 7:
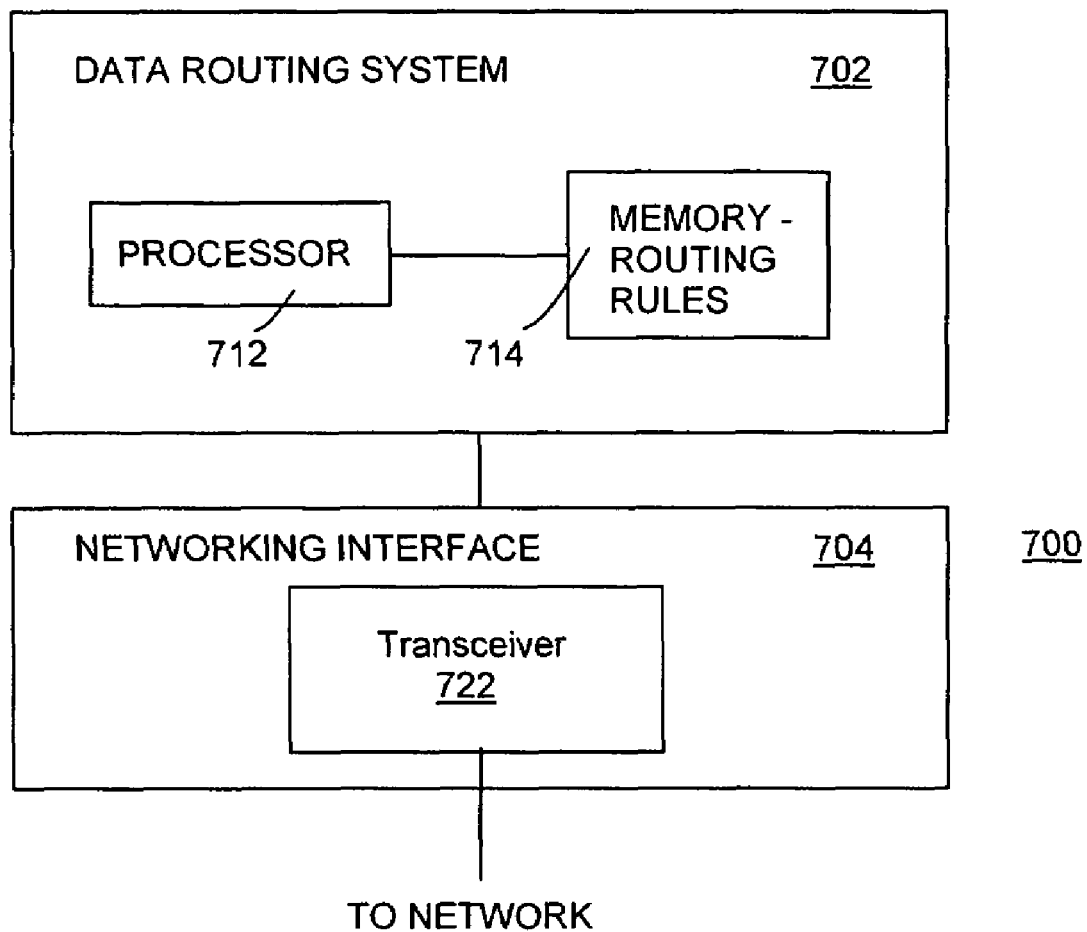
FIG. 7 illustrates an example system having an optoelectronic component that includes the multi-layered heteostructure of FIG. 1, in accordance with various embodiments.

FIG. 7 illustrates an example communication system, in accordance with one embodiment. As illustrated, example system 700 includes data routing subsystem 702 and network interface module 704 coupled to each other as shown. Network interface module 704 is employed to optically coupled communication system 700 to a network, which may be a local area network, a wide area network, a telephone network, and so forth. These networks may be private and/or public. For the embodiment, network interface module 704 includes in particular, a transceiver 722 having an optoelectronic component that includes one or more devices formed in like manner as device 100 of FIG. 1. For the purpose this specification, network interface module 704 may also be referred to as a communication interface.

Still referring to FIG. 7, for the embodiments, data routing subsystem 702 includes processor 712 and memory 714 coupled to each other as shown. Memory 714 has stored therein a number of data routing rules, according to which processor 712 routes data received through networking interface module 704. The data routing rules may be stored employing any one of a number of data structure techniques, including but are not limited to e.g. tables, link lists, and so forth. The data may be received and forwarded in accordance with any one of a number of communication protocols, including but are not limited to e.g. the Transmission Control Protocol/Internet Protocol (TCP/IP).

Except for the incorporation of transceiver 722 with network interface module 704, elements 702-704 represent a broad range of these elements known in the art or to be designed In various embodiments, example system 700 may be a router, a switch, a gateway, a server, and so forth.

Although specific embodiments have been illustrated and described herein, it will be appreciated by those of ordinary skill in the art that a wide variety of alternate and/or equivalent implementations may be substituted for the specific embodiments shown and described, without departing from the scope of the present invention. This application is intended to cover any adaptations or variations of the embodiments discussed herein. Therefore, it is manifestly intended that this invention be limited only by the claims and the equivalents thereof.

What is claimed is:

1. An apparatus comprising:
   an inactive layer having a first width;
   a heterostructure including a plurality of active layers, the plurality of active layers including a first active layer having a second width, narrower than the first width, disposed on a bottom surface of the inactive layer so that the inactive layer overhangs the first active layer and defines a first undercut at a first side of the first active layer;

a passivation material disposed in said first undercut, sealing the first side of the first active layer; and a metal contact layer on the inactive layer, wherein the metal contact layer is in direct physical contact with a top surface and sidewalls of the inactive layer.

2. The apparatus of claim 1, wherein the inactive layer is an ohmic contact layer, and the first active layer comprises a selected one of indium gallium arsenide and indium phosphide.

3. The apparatus of claim 1, wherein the passivation material comprises a polymer material.

4. The apparatus of claim 1, wherein the inactive layer and the first active layer further define a second undercut at a second side of the first active layer underneath the inactive layer, and wherein the passivation material is disposed in the second undercut, sealing the second side of the first active layer.

5. The apparatus of claim 4, wherein the first and second sides are opposite sides of the first active layer.

6. The apparatus of claim 4, wherein the plurality of active layers include a second active layer having a third width, narrower than the first width, disposed underneath the first active layer, joining the inactive layer and the first active layer in defining the first and second undercuts.

7. The apparatus of claim 6, wherein the second and third widths have a relationship selected from a relationship group consisting of a first relationship where the second width is greater than the third width, a second relationship where the second and third widths are equal, and a third relationship where the second width is narrower than the third width.

8. The apparatus of claim 1, wherein the plurality of active layers include a second active layer having a third width, narrower than the first width, disposed underneath the first active layer, joining the inactive layer and the first active layer in defining the first undercut.

9. The apparatus of claim 1, further comprising an optoelectronic component including the inactive layer, the heterostructure, and the passivation material.

10. A system comprising:

a data routing subsystem including memory to store a plurality of data routing rules, and a processor coupled to the memory to route data based at least in part on the stored data routing rules; and a network interface module coupled to the data routing subsystem to transmit and receive data for the data routing subsystem, the network interface module including an optoelectronic component having:

an inactive layer having a first width;

a heterostructure including a plurality of active layers, the plurality of active layers including a first active layer having a second width, narrower than the first width, disposed on a bottom surface of the inactive layer so that the inactive layer overhangs the first active layer and defines a first undercut at a first side of the first active layer;

a passivation material disposed in said first undercut, sealing the first side of the first active layer; and a metal contact layer on the inactive layer, wherein the metal contact layer is in direct physical contact with a top surface and sidewalls of the inactive layer.

11. The system of claim 10, the passivation material comprises a polymer material.

12. The system of claim 10, wherein the inactive layer and the first active layer further define a second undercut at a second side of the first active layer underneath the inactive layer, and wherein the passivation material is disposed in the second undercut, sealing the second side of the first active layer.

13. The system of claim 12, wherein the plurality of active layers include a second active layer having a third width, narrower than the first width, disposed underneath the first active layer, joining the inactive layer and the first active layer in defining the first and second undercuts.

14. The system of claim 13, wherein the second and third widths have a relationship selected from a relationship group consisting of a first relationship where the second width is greater than the third width, a second relationship where the second and third widths are equal, and a third relationship where the second width is narrower than the third width.

15. The system of claim 10, wherein the plurality of active layers include a second active layer having a third width, narrower than the first width, disposed underneath the first active layer, joining the inactive layer and the first active layer in defining the first undercut.

16. The system of claim 10, wherein the system is a router, a switch or a gateway.

17. The apparatus of claim 9, wherein the plurality of active layers include a second active layer having a third width, narrower than the first width, disposed underneath the first active layer, joining the inactive layer and the first active layer in defining the first undercut.

18. The apparatus of claim 1, wherein the heterostructure is formed on an indium phosphide substrate.

19. The apparatus of claim 1, wherein the metal contact layer is in contact with a top surface of the passivation material.

20. The apparatus of claim 1, wherein the apparatus is an optoelectronic component.

21. The apparatus of claim 1, wherein the plurality of active layers comprise two or more different semiconductor materials.

22. The apparatus of claim 1, wherein the plurality of active layers include a second active layer disposed on a bottom surface of the first active layer, wherein the first active layer comprises a first semiconductor material and the second active layer comprises a second semiconductor material, the first semiconductor material and the second semiconductor material being different semiconductor materials.

* * * * *